United States Patent
Wang et al.

(10) Patent No.: US 9,379,726 B1
(45) Date of Patent: Jun. 28, 2016

(54) ADAPTIVE ASYNCHRONOUS SAR ADC

(71) Applicant: Broadcom Corporation, Irvine, CA (US)

(72) Inventors: Tao Wang, Irvine, CA (US); Chun-Ying Chen, Irvine, CA (US); Massimo Brandolini, Mission Viejo, CA (US); Wei Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/638,532

(22) Filed: Mar. 4, 2015

(51) Int. Cl.
*H03M 1/38* (2006.01)
*H03M 1/00* (2006.01)
*H03M 1/46* (2006.01)
*H03M 1/06* (2006.01)

(52) U.S. Cl.
CPC ............ *H03M 1/002* (2013.01); *H03M 1/0607* (2013.01); *H03M 1/468* (2013.01)

(58) Field of Classification Search
CPC ... H03M 1/002; H03M 1/468; H03M 1/0607; H03M 1/38; H03M 1/40
USPC .................. 341/155, 161, 163, 172
See application file for complete search history.

(56) References Cited

U.S. PATENT DOCUMENTS

| | | | | |
|---|---|---|---|---|
| 7,839,319 B2* | 11/2010 | Nittala | ............... | H03M 1/462 341/160 |
| 7,986,257 B2* | 7/2011 | Yoshioka | ......... | H03K 3/356121 341/155 |
| 8,193,957 B2* | 6/2012 | Yoshioka | ............ | H03M 1/462 341/118 |
| 8,344,925 B1* | 1/2013 | Evans | ................. | H03M 1/462 341/118 |
| 8,669,896 B2* | 3/2014 | Tsai | .................... | H03M 1/462 341/155 |
| 8,907,834 B2* | 12/2014 | Lee | .................... | H03M 1/1009 341/120 |
| 8,922,415 B2* | 12/2014 | Fogleman | ............ | H03M 1/462 341/160 |

* cited by examiner

*Primary Examiner* — Khai M Nguyen
(74) *Attorney, Agent, or Firm* — Sterne, Kessler, Goldstein & Fox P.L.L.C.

(57) ABSTRACT

The present disclosure is directed to a system and method for adjusting a conversion speed of an asynchronous SAR ADC based on a margin of time between when a conversion of a sample of an analog signal completes and a next sample of the analog signal is taken, referred to as a "conversion time margin." The system and method reduce the conversion speed of an asynchronous SAR ADC when the conversion time margin permits to reduce the amount of power consumed and/or noise produced by the asynchronous SAR ADC.

20 Claims, 8 Drawing Sheets

ADAPTIVE ASYNCHRONOUS SAR ADC

FIELD OF THE INVENTION

This application relates generally to analog-to-digital converters (ADCs), including asynchronous successive approximation register (SAR) ADCs.

BACKGROUND

Conceptually, analog-to-digital conversion is performed in two steps: an analog input signal is sampled, and then the sample is quantized into a digital output value. There are many implementations for performing this two-step process, each of which can be differentiated based on its associated power consumption, conversion speed, and/or area.

One such implementation is the successive approximation register (SAR) analog-to-digital converter (ADC). The SAR ADC is popular for its comparative power and area advantages over other implementations, making it ideal for use in many portable and battery powered devices. As its name implies, the SAR ADC works by successively comparing a sample of an analog signal to an analog representation of the sample's digital approximation. The digital approximation is updated based on each comparison in accordance with a binary search algorithm to more accurately represent the analog sample until a final digital approximation is produced.

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the disclosure. However, it will be apparent to those skilled in the art that the disclosure, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of this discussion, the term "module" shall be understood to include software, firmware, or hardware (such as one or more circuits, microchips, processors, and/or devices), or any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

1. SYNCHRONOUS SAR ADCS

Figure 1:
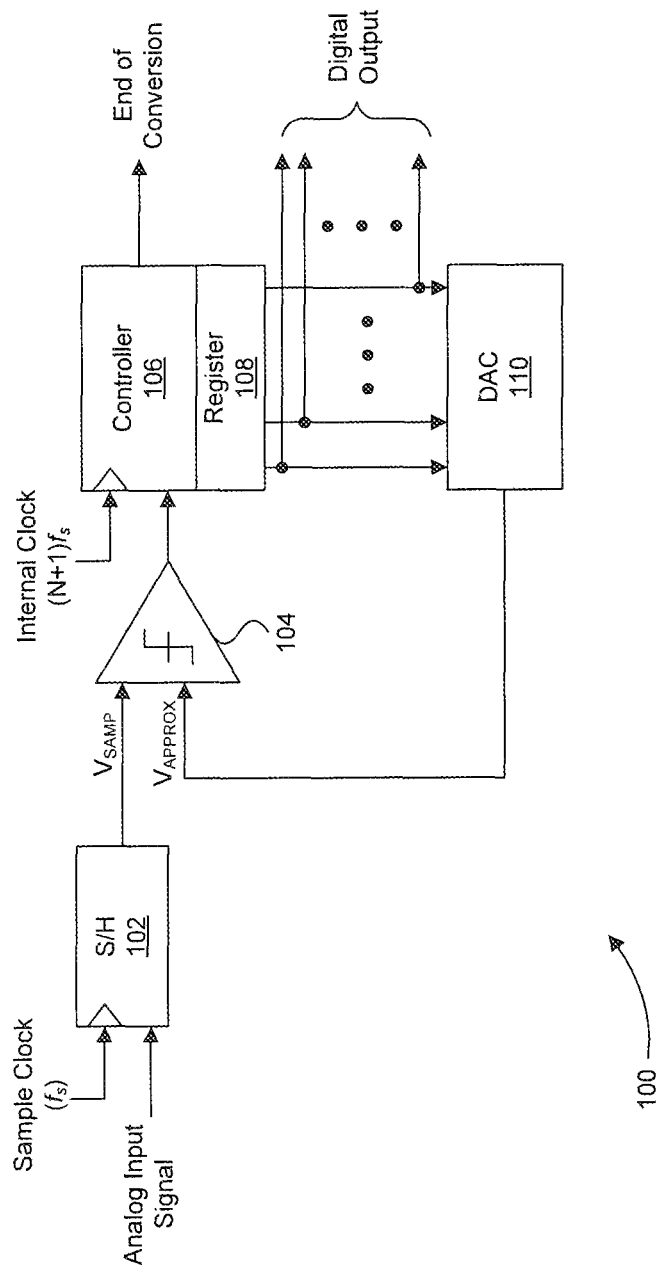
FIG. 1 illustrates an example synchronous successive approximation register (SAR) analog-to-digital converter (ADC).

FIG. 1 illustrates an example successive approximation register (SAR) analog-to-digital converter (ADC) 100 that includes a sample-and-hold circuit 102, a comparator 104, a controller 106, a register 108, and a digital-to-analog converter (DAC) 110. SAR ADC 100 completes a conversion of an analog sample in N sequentially executed steps, where N is the output resolution of SAR ADC 100. The first step begins after sample-and-hold circuit 102 takes a sample of the analog input signal to be digitized.

In step 1, controller 106 sets the most significant bit (MSB) of the sample's digital approximation value stored in register 108 to '1' and all other bits of the digital approximation value to '0'. This setting of the digital approximation value corresponds to its mid-range value. The digital approximation value is then converted to an analog approximation value by DAC 110 and provided to comparator 104 for comparison against the analog sample held by sample-and-hold circuit 102. If comparator 104 indicates that the analog sample held by sample-and-hold circuit 102 is less than the analog approximation value, controller 106 sets the MSB of the digital approximation value to '0'. Conversely, if comparator 104 indicates that the analog sample held by sample-and-hold circuit 102 is greater than the analog approximation value, controller 106 leaves the MSB of the digital approximation value equal to '1'. The conversion process then proceeds to step 2.

In step 2, controller 106 sets the next MSB (i.e., the second MSB for step 2) of the digital approximation value stored in register 108 to '1'. The digital approximation value is then again converted to an analog approximation value by DAC 110 and provided to comparator 104 for comparison against the analog sample held by sample-and-hold circuit 102. If comparator 104 indicates that the analog sample held by sample-and-hold circuit 102 is less than the analog approximation value, controller 106 sets the second MSB of the digital approximation value back to '0'. Conversely, if comparator 104 indicates that the analog sample held by sample-and-hold circuit 102 is greater than the analog approximation value, controller 106 leaves the second MSB of the digital approximation value equal to '1'. The process of step 2 is repeated for each remaining bit of the N-bit digital approximation value stored in register 108 in accordance with a binary search algorithm. After the process is complete, the digital approximation value stored in register 108 is provided as the digital output of SAR ADC 100.

Many SAR ADCs, such as SAR ADC 100, execute the N sequential conversion steps in a synchronous manner. In other words, the N conversion steps are executed at regular intervals of time set by an internal clock with a period long enough to allow the logic used to execute each of the N conversion steps to respond to changes at their inputs as well as to allow their outputs to settle to stable logic values. For SAR ADC 100, this period includes, for example, the worst case time required by DAC 110 to convert the digital approximation value stored in register 108 to a stable analog approximation value at its output, the worst case time required by comparator 104 to compare the analog approximation value to the sample held by sample-and-hold circuit 102, and the worst case time required for controller 106 to update the digital approximation value stored in register 108 based on the result of the comparison performed by comparator 104. In addition to the internal clock, many SAR ADCs, such as SAR ADC 100, use a sample clock to sample the analog input signal at regular intervals. The sample clock sets the sample rate of the SAR ADC. For a sample clock with a frequency $f_s$, the internal clock is typically required to run at a frequency of $(N+1)f_s$, which provides 1 cycle for sampling and N cycles for conversion.

Figure 2:
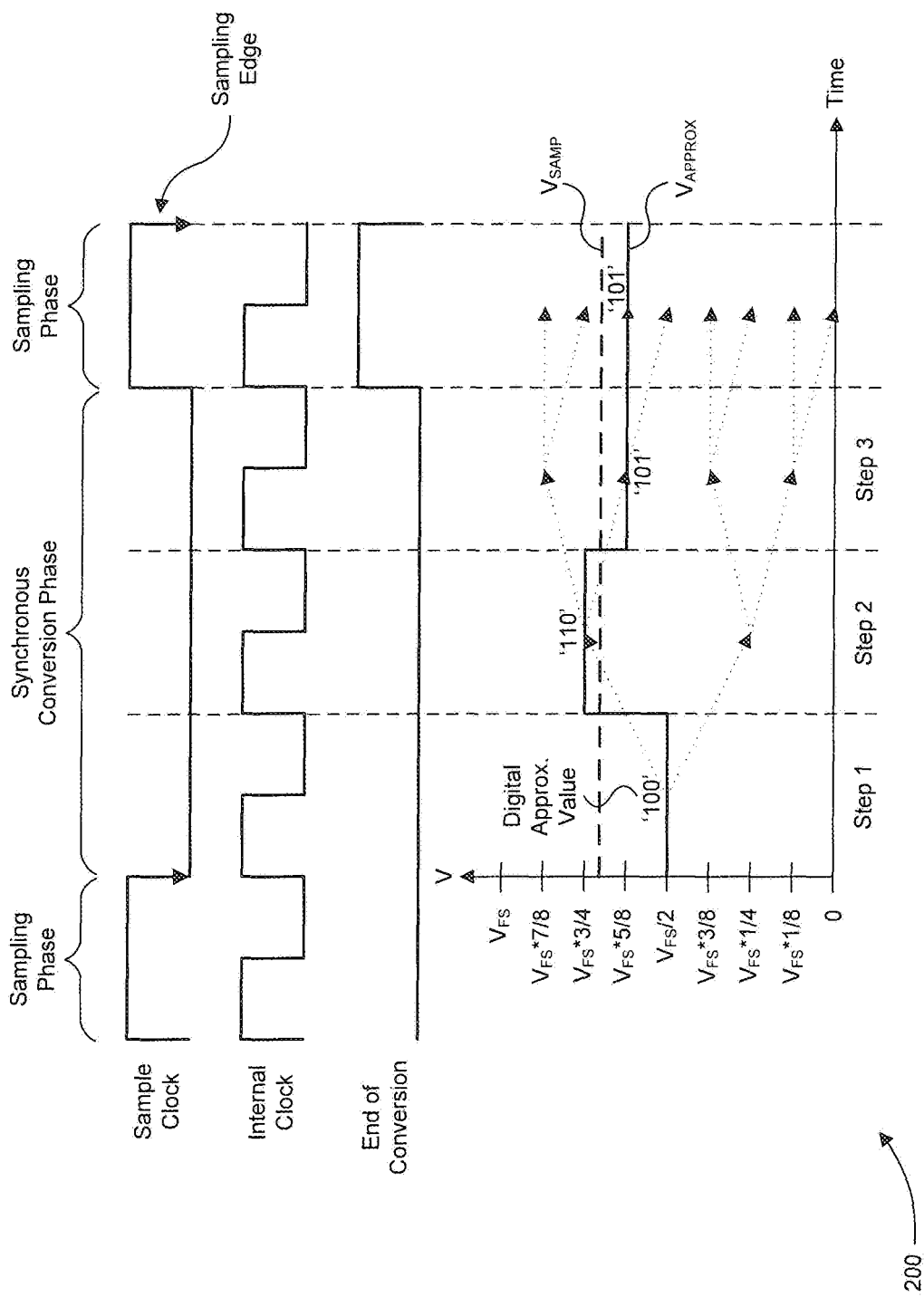
FIG. 2 illustrates a waveform diagram of the operation of the example synchronous SAR ADC in FIG. 1.

FIG. 2 shows an example waveform diagram 200 that illustrates the operation of SAR ADC 100 for a 3-bit implementation (i.e., N=3). Waveform diagram 200 specifically illustrates the sample clock waveform and the internal clock waveform. The sample clock breaks down the analog-to-digital conversion process of SAR ADC 100 into two phases: a sampling phase, during which time the output of sample-and-hold circuit 102 tracks the analog input signal and eventually holds a sample of the tracked analog input signal on a sampling edge, and a synchronous conversion phase that includes the N sequential conversion steps discussed above. FIG. 2 further illustrates how the state of the digital approximation value stored in register 108 of SAR ADC 100 is updated from step-to-step during the conversion phase in a synchronous manner with the internal clock.

In step 1 of the synchronous conversion phase, as shown in FIG. 2, the digital approximation value is set to its mid-range value at '100'. DAC 110 converts the digital approximation value to an analog approximation value $V_{APPROX}$ and then compares $V_{APPROX}$ to the analog sample held by sample-and-hold circuit 102. In FIG. 2, the analog sample has a given value $V_{SAMP}$. Because $V_{SAMP}$ is greater than $V_{APPROX}$ in step 1 of the example conversion, the MSB of the digital approximation value remains set at '1'. The remaining steps are then executed as described above in accordance with a binary search algorithm until the final digital approximation value of '101' is provided as the digital output of SAR ADC 100. Controller 106 can signal the end of the conversion using an end of conversion signal as shown in FIG. 2.

The main advantage of a synchronous SAR ADC that uses an internal clock is that the SAR ADC is guaranteed to be stable and reliable. The main disadvantage of a synchronous SAP, ADC that uses an internal clock is that not all of the N conversion steps will require the full period of the internal clock to complete because the period of the internal clock is generally determined based on worst case conditions that are not always present. Nevertheless, each conversion step will occupy the full period.

To this end, asynchronous SAR ADCs have been proposed. In an asynchronous SAR, the sample clock is typically still used for uniform sampling of the analog signal but the internal clock is eliminated. The execution time for each of the N conversion steps is no longer fixed and uniform. Instead, after each of the N conversion steps completes, the next step in the conversion process begins without any substantial delay in between. The general result is faster conversion times.

2. ADAPTIVE ASYNCHRONOUS SAR ADCS

Although asynchronous SAR ADCs can provide faster conversion times than synchronous SAR ADCs, the faster conversion times are often not fully utilized because of potential variations in process, voltage, and temperature over which the asynchronous SAR ADCs are designed to operate. More specifically, these potential variations can slow down the speed at which an asynchronous SAR ADC operates and, therefore, the speed at which the asynchronous SAR ADC can perform a conversion. As a result, an asynchronous SAR ADC often over performs, in terms of speed, because it is designed to ensure required conversion times are met for worst case process, voltage, and temperature conditions that are not always present.

A similar over performance issue can result when an asynchronous SAR ADC is operating at a sample rate that is below the highest sample rate that the asynchronous SAR ADC is designed to operate. Although not necessary at the slower sample rate, the asynchronous SAR ADC will continue to perform conversions at a high rate sufficient to ensure proper operation when the sample rate is at its highest supported value.

In general, at higher conversion speeds an asynchronous SAR ADC is consuming more power and/or producing more noise than at lower conversion speeds. The present disclosure is directed to a system and method for adjusting the conversion speed of an asynchronous SAR ADC based on the margin of time between when a conversion of a sample of an analog signal completes and a next sample of the analog signal is taken (e.g. tracked and held). This margin of time can be referred to as the "conversion time margin" and is essentially a measure of how much an asynchronous SAR ADC is over performing in terms of speed. The system and method of the present disclosure reduce the conversion speed of an asynchronous SAR ADC when the conversion time margin permits to reduce the amount of power consumed and/or noise produced by the asynchronous SAR ADC. These and other features of the present disclosure are described further below.

Figure 3:
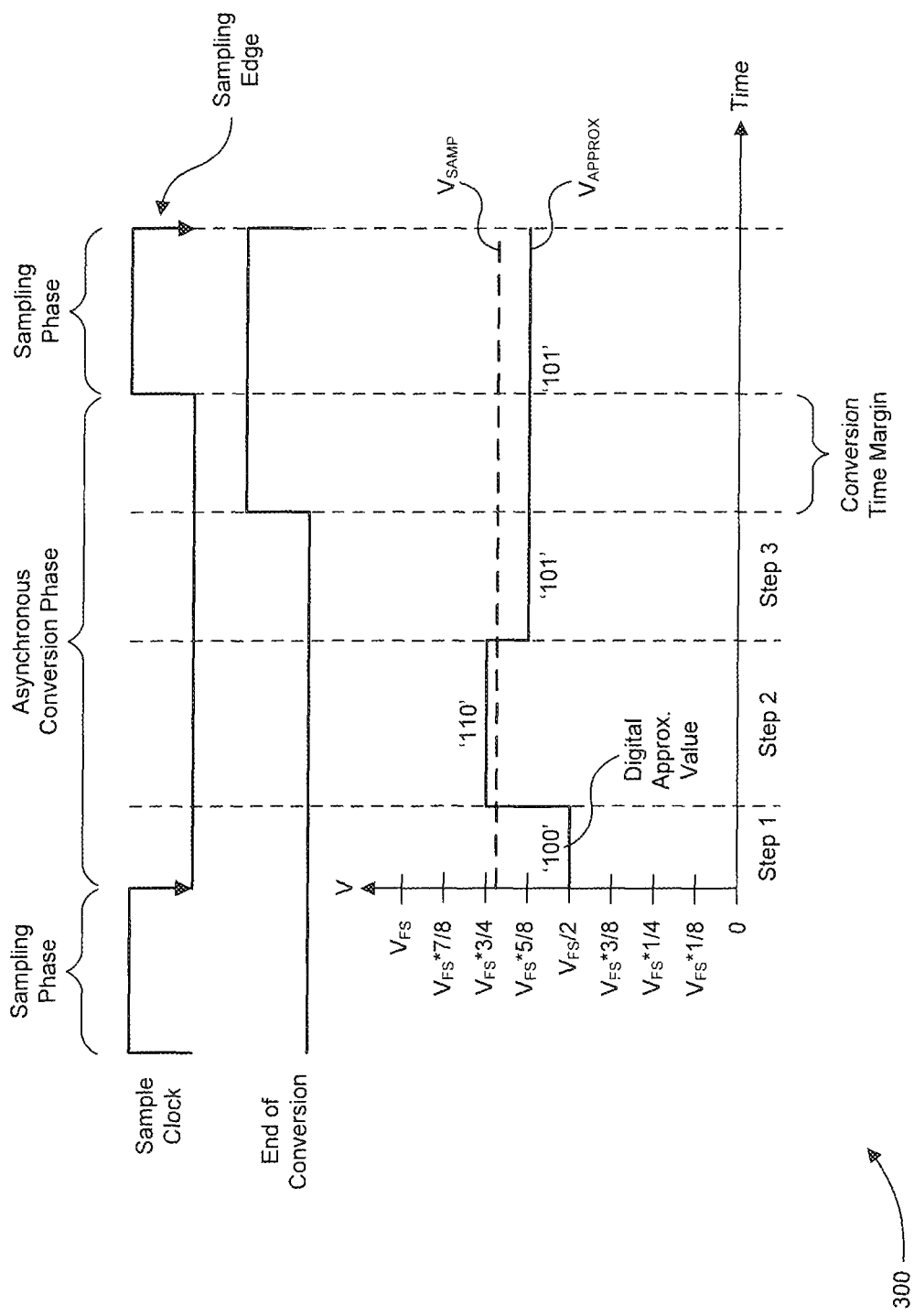
FIG. 3 illustrates waveform diagram illustrating the operation of an example asynchronous SAR ADC according to embodiments of the present disclosure.

Referring now to FIG. 3, an example waveform diagram 300 that illustrates the operation of a 3-bit asynchronous SAR ADC is shown in accordance with embodiments of the present disclosure. The asynchronous SAR ADC can have the same general configuration of synchronous SAR ADC 100 shown in FIG. 1, but the operation of the conversion logic (e.g., controller 106, register 108, DAC 110, and comparator 104) is no longer synchronized to an internal clock.

As shown in FIG. 3, the sample clock breaks down the conversion of the analog input signal into two phases: a sampling phase, during which time the output of the sample-and-hold circuit of the asynchronous SAR ADC tracks the analog input signal and eventually holds a sample of the tracked analog input signal on a sampling edge, and an asynchronous conversion phase that includes the N sequential conversion steps described above. FIG. 3 illustrates how the state of the digital approximation value of the asynchronous SAR ADC is updated from step-to-step in an asynchronous manner during the asynchronous conversion phase. Unlike synchronous SAR ADCs, the execution time for each of the N conversion steps is no longer fixed and uniform. Instead, after each of the N conversion steps completes, the next step in the conversion process begins without any substantial delay in between.

The one exception to this is after the final step in the conversion process. As shown in FIG. 3, there is a conversion time margin between when the final step completes and a subsequent sample of the analog input signal is taken (e.g., tracked and held). As described above, this conversion time margin often exists in asynchronous SAR ADCs because of potential variations in process, voltage, temperature, and sample rate over which the asynchronous SAR ADCs are designed to operate. In general, the existence of a conversion time margin means that the asynchronous SAR ADC is over performing in terms of conversion speed and, as a result, consuming more power and/or producing more noise than necessary. To provide further context, FIGS. 4 and 5 illustrate how the conversion time margin changes due to process, voltage, temperature, and sample rate variations.

Figure 4:
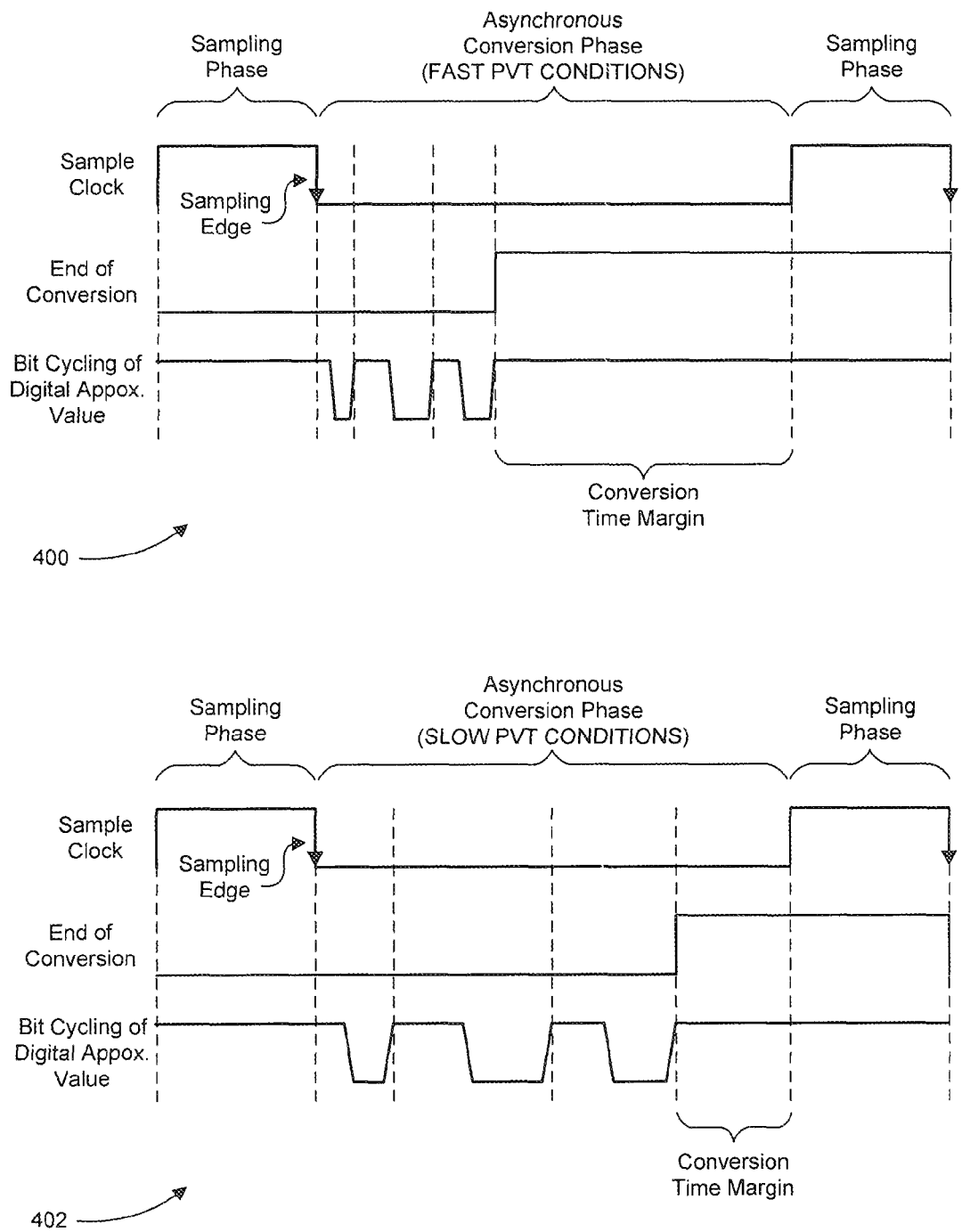
FIG. 4 illustrates two waveform diagrams illustrating a difference in conversion time margin of an asynchronous SAR ADC due to process, supply voltage, and/or temperature variations according to embodiments of the present disclosure.

Referring now to FIG. 4, two waveform diagrams that show a difference in conversion time margin for two implementations of the same asynchronous SAR ADC design due to process, supply voltage, and/or temperature variations are illustrated according to embodiments of the present disclosure. As mentioned above, these potential variations can slow down the speed at which an implementation of an asynchronous SAR ADC operates and, therefore, the speed at which the implementation can perform a conversion. As a result, an implementation of an asynchronous SAR ADC often over performs, in terms of speed, because it is designed to ensure required conversion times are met for worst case process, voltage, and temperature conditions. Process variations include, for example, variations in the critical dimensions of devices, such as transistors, and doping concentrations that affect transistor switching ability.

Waveform 400 in FIG. 4 specifically illustrates the operation of a first implementation of a 3-bit asynchronous SAR ADC design with a faster combined process, voltage, and temperature (PVT) condition as compared to the second implementation of the same asynchronous SAR ADC design, the operation of which is illustrated by waveform 402 in FIG. 4. Both waveforms 400 and 402 show the cycling of the 3-bits of the digital approximation value as the 3 sequential conversion steps are performed for the same analog sample. As can be seen, the conversion time margin changes based on different PVT conditions. More specifically, the conversion time margin is larger for faster combined PVT conditions.

Figure 5:
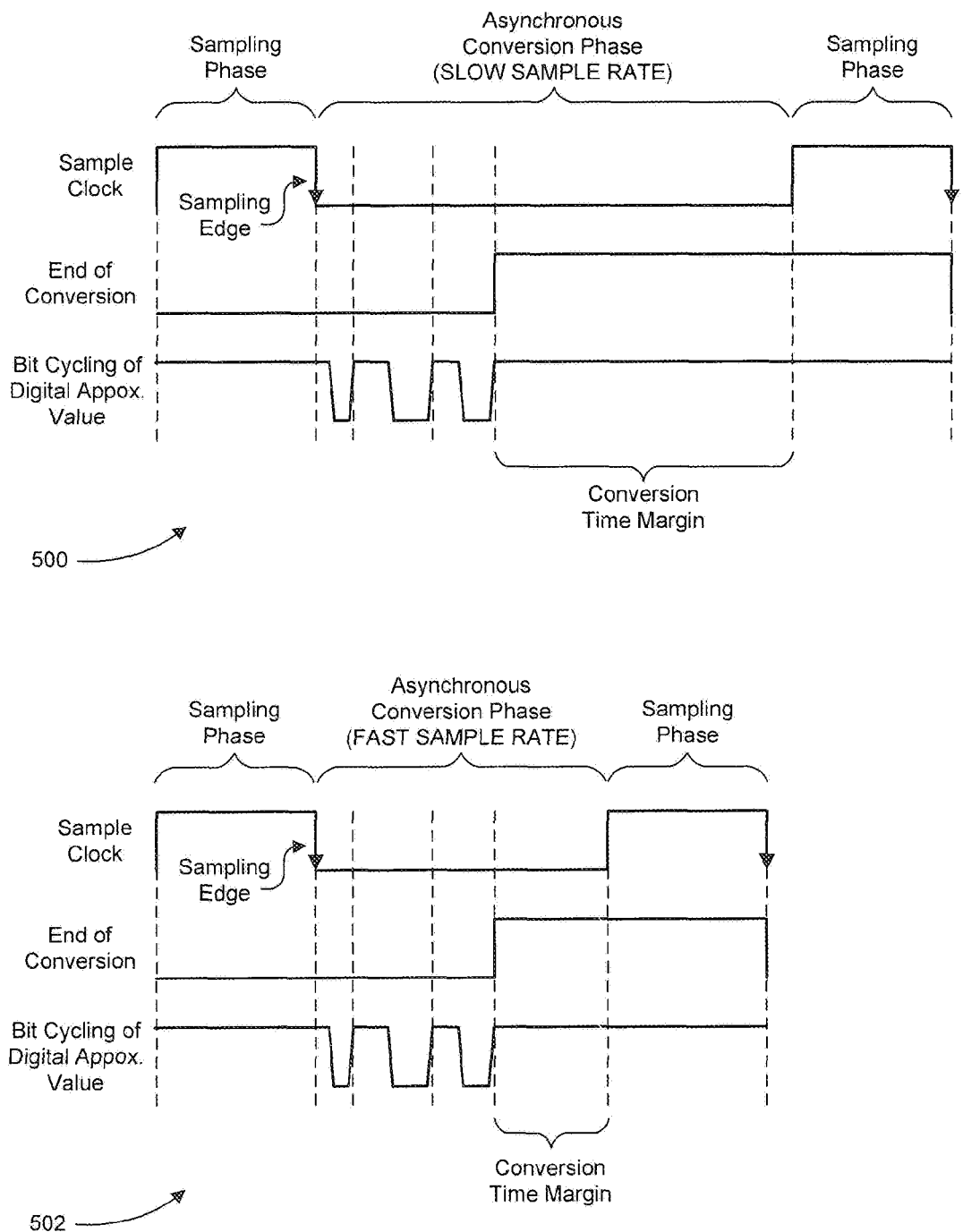
FIG. 5 illustrates two waveform diagrams illustrating a difference in conversion time margin of an asynchronous SAR ADC due to sample rate variation according to embodiments of the present disclosure.

Referring now to FIG. 5, two waveform diagrams that show a difference in conversion time margin for the same asynchronous SAR ADC design due to sample rate variation are illustrated according to embodiments of the present disclosure. As mentioned above, an over performance issue can result when an asynchronous SAR ADC is operating at a sample rate that is below the maximum sample rate that the asynchronous SAR ADC is designed to operate. Although not necessary at the slower sample rate, the asynchronous SAR ADC will continue to perform conversions at a high rate sufficient to ensure proper operation when the sample rate is at its highest supported value.

Waveform 500 specifically illustrates the operation of a first implementation of the asynchronous SAR ADC design operating at slow sample rate as compared to the second implementation of the same asynchronous SAR ADC design, the operation of which is illustrated by waveform 502. Both waveforms 500 and 502 show the cycling of the 3-bits of the digital approximation value as the 3 sequential conversion steps are performed for the same analog sample and for similar process, voltage, and temperature conditions. As can be seen, the conversion time margin changes based on different sample rates. More specifically, the conversion time margin is larger for slower sample rates.

Figure 6:
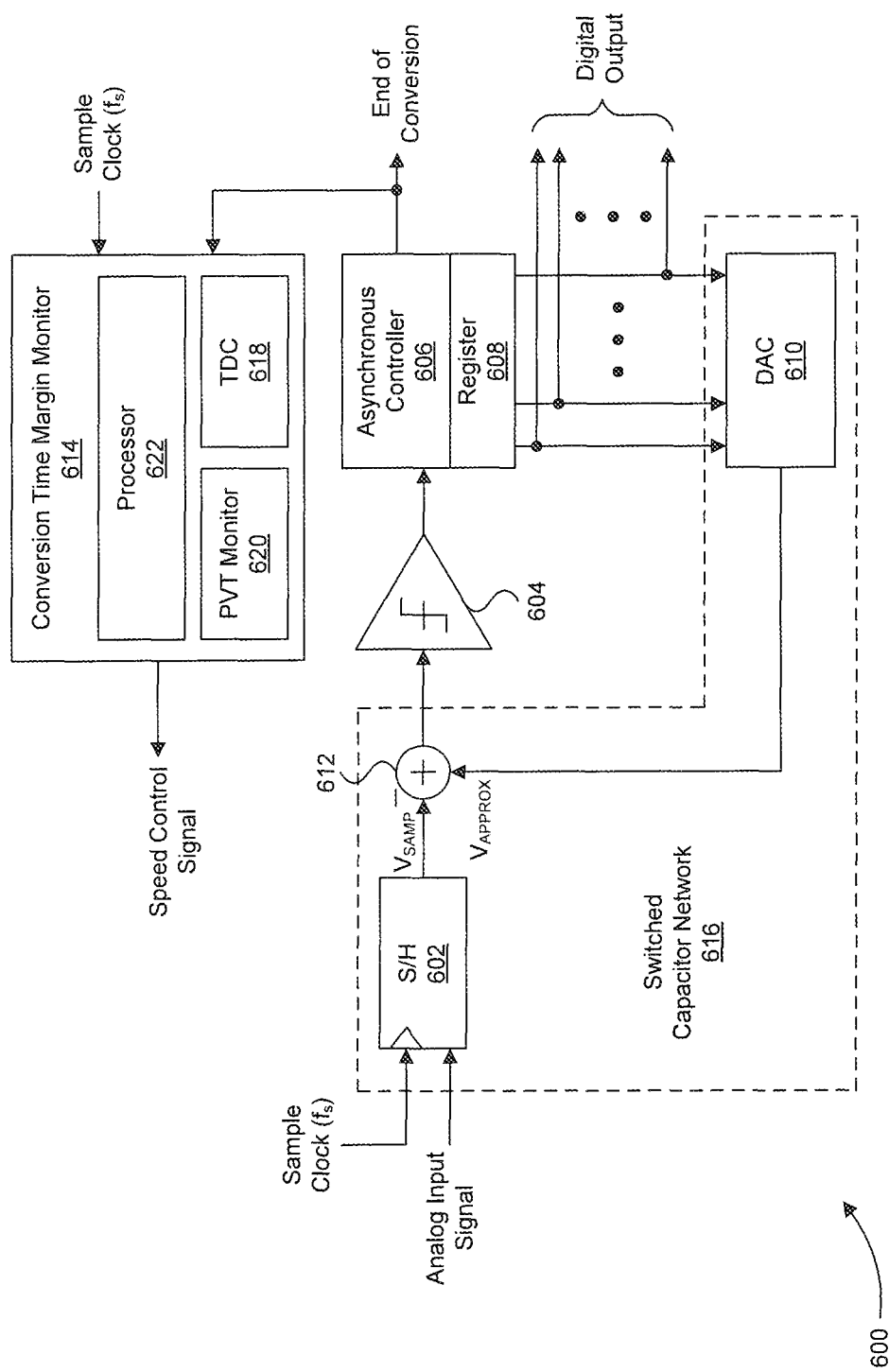
FIG. 6 illustrates an example adaptive asynchronous SAR ADC according to embodiments of the present disclosure.

Referring now to FIG. 6, an example adaptive asynchronous SAR ADC 600 is illustrated according to embodiments of the present disclosure. Adaptive asynchronous SAR ADC 600 is configured to adapt its conversion speed based on an indirect and/or direct measure of the conversion time margin to reduce the amount of power consumed and/or noise produced by adaptive asynchronous SAR ADC 600. As illustrated in FIG. 6, adaptive asynchronous SAR ADC 600 includes a sample-and-hold circuit 602, a comparator 604, an asynchronous controller 606, a register 608, a DAC 610, an adder 612, and a conversion time margin monitor 614. Although sample-and-hold circuit 602, DAC 610, and adder 612 are shown and described below as separate components, their respective functionalities can be implemented as one switched capacitor network 616 as will be appreciated by one of ordinary skill in the art.

The general operation of adaptive asynchronous SAR ADC 600 follows that described above with respect to example waveform diagram 300 shown in FIG. 3. After sample-and-hold circuit 602 takes a sample of the analog input signal to be digitized during the sampling phase, the sample is converted to a digital value in N sequentially executed steps during the asynchronous conversion phase, where N is the output resolution of adaptive asynchronous SAR. ADC 600. Because SAR ADC 600 is an asynchronous design, the execution time for each of the N conversion steps is not fixed or uniform. Instead, after each of the N conversion steps completes, the next step in the conversion process begins without any substantial delay in between. The one exception to this, as described above, is after the final step in the conversion process. After the final conversion step completes, there can be a conversion time margin between when the final step completes and a subsequent sample of the analog input signal is taken (e.g., tracked and held).

Stepping through the conversion process as it relates specifically to adaptive asynchronous SAR ADC 600, in step 1 asynchronous controller 606 sets the most significant bit (MSB) of the sample's digital approximation value stored in register 608 to '1' and all other bits of the digital approximation value to '0'. This setting of the digital approximation value corresponds to its mid-range value. The digital approximation value is then converted to an analog approximation value by DAC 610 and provided to adder 612 that determines the difference between the analog approximation value and the analog sample held by sample-and-hold circuit 602. The difference is then provided to comparator 604, which acts as a zero crossing detector. If comparator 604 indicates that the difference is greater zero, asynchronous controller 606 sets the MSB of the digital approximation value from '1' to '0'.

Conversely, if comparator 604 indicates that the difference is less than zero, asynchronous controller 606 leaves the MSB of the digital approximation value equal to '1'. The conversion process then proceeds to step 2.

In step 2, asynchronous controller 606 sets the next MSB (i.e., the second MSB for step 2) of the digital approximation value stored in register 608 to '1'. The digital approximation value is then again converted to an analog approximation value by DAC 610 and provided to adder 612 that determines the difference between the analog approximation value and the analog sample held by sample-and-hold circuit 602. The difference is then provided to comparator 604. If comparator 604 indicates that the difference is greater zero, asynchronous controller 606 sets the second MSB of the digital approximation value from '1' to '0'. Conversely, if comparator 604 indicates that the difference is less than zero, asynchronous controller 606 leaves the second MSB of the digital approximation value equal to F. The process of step 2 is repeated for each remaining bit of the N-bit digital approximation value stored in register 608 in accordance with a binary search algorithm. After the process is complete, the end of conversion signal is asserted by asynchronous controller 606 and the digital approximation value stored in register 608 is provided as the digital output of SAR ADC 600.

In one embodiment, conversion time margin monitor 614 is configured to directly measure the conversion time margin or an amount of time between when asynchronous controller 606 provides the final digital value and sample-and-hold circuit 602 takes a subsequent sample of the analog input signal. For example, conversion time margin monitor 614 can directly measure the conversion time margin by determining the amount of time between the rising edge of the end of conversion signal provided by asynchronous controller 606 and the rising edge of the sample clock as shown in example waveform diagram 300 of FIG. 3 (other designs may use falling edges and/or a combination of rising and falling edges). Conversion time margin monitor 614 can specifically use a time-to-digital converter (TDC) 618 to determine the amount of time between the respective rising edges of the end of conversion signal and the sample clock. TDC 618 can be, for example, any one of a delay chain TDC, Vernier TDC, or gated ring oscillator TDC. In general, a TDC measures an unknown time interval by counting how many intervals of a known reference duration are included in the unknown time interval.

In another embodiment, conversion time margin monitor 614 is configured to indirectly measure the conversion time margin or an amount of time between when asynchronous controller 606 provides the final digital value and sample-and-hold circuit 602 takes a subsequent sample of the analog input signal. For example, conversion time margin monitor 614 can indirectly measure the conversion time margin using a process, voltage, and/or temperature (PVT) monitor 620. PVT monitor 620 can include, for example, delay chains and ring oscillators for measuring signal propagation delays to characterize process, temperature, and/or voltage. The monitored process, voltage, and/or temperature conditions by PVT monitor 620 can be used by conversion time margin monitor 614 as an indirect measure of the conversion time margin. For example, for higher temperatures or lower voltages, a smaller conversion time margin can be assumed.

In yet another embodiment, conversion time margin monitor 614 is configured to use some combination of direct and indirect measurement of the conversion time margin as described above.

Based on the measured conversion time margin or an average of several measured conversion time margins, conversion time margin monitor 614 can adjust a conversion speed associated with asynchronous SAR ADC 600 using a speed control signal. More specifically, conversion time margin monitor 614 can slow down the conversion speed associated with asynchronous SAR ADC 600 based on the measured conversion time margin so that conversions of samples of the analog input signal by asynchronous SAR ADC 600 complete with a reduced conversion time margin or a conversion time margin below some desired value or below some percentage of the period of the sample clock. Reducing the conversion time margin means asynchronous SAR ADC 600 is performing, in terms of conversion speed, more closely to required levels, which (depending on how the conversion speed is reduced) can lead to reduced power consumption and/or noise production. In one embodiment, conversion time margin monitor 614 can use processor 622 to analyze the output of TDC 618 and/or PVT 620 and generate the speed control signal.

It should be noted that an average measured conversion time margin, determined based on a number of measured conversion time margins, can be used to adjust the conversion speed, as opposed to a single measured conversion time margin, to reduce the known dependence of the conversion time margin on the value of the analog sample converted. The conversion speed is to be adjusted to reduce over performance caused primarily by variations in process, voltage, temperature, and/or sample rate rather than over performance caused by variations in the values of the analog samples converted. In one example, a moving average can be used to average measured conversion time margins. In another example, a weighted average can be used that can weight more recent measures of the conversion time margin more heavily than those measured later in time.

In one embodiment, conversion time margin monitor 614 is configured to use the speed control signal to adjust an operation speed of asynchronous SAR ADC 600 by adjusting a supply voltage or supply current used to power one or more devices of DAC 610, comparator 604, or asynchronous controller 606. In general, each node within a circuit has an associated capacitance. Circuit operation typically depends on toggling or changing the voltage at these nodes (e.g., from a logic high voltage to a logic low voltage). By applying a smaller supply voltage or supply current to these nodes, their associated capacitances will be charged and/or discharged less quickly, resulting in slower operation of the circuit but at the benefit of reduced power consumption levels.

In another embodiment, conversion time margin monitor 614 is configured to use the speed control signal to adjust an operation speed of asynchronous SAR ADC 600 by adjusting a gain of a regenerative latch used to implement, in part, comparator 604 in at least one implementation of comparator 604. An example of such a regenerative latch is shown in FIG. 7.

Figure 7:
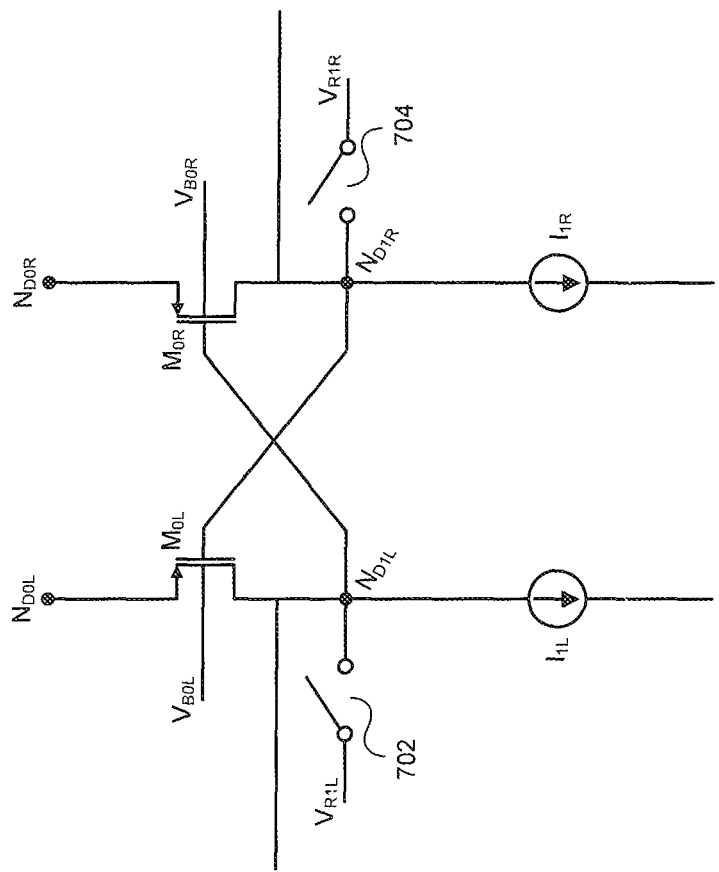
FIG. 7 illustrates a portion of an example regenerative latch used to implement a dynamic comparator according to embodiments of the present disclosure.

Referring to FIG. 7, regenerative latch 700 provides the output of comparator 604 at nodes $N_{D1L}$ and $N_{D1R}$ in complimentary form. When the output of comparator 604 has a logic state of '11', the comparator is in a reset state. When the output of comparator 604 has a state of '10' or '01', the comparator is in a ready state and the result of the comparison can be determined based on which of these two states the output of comparator 604 is in. Regenerative latch 700 is placed in the reset state by closing switches 702 and 704, which sets the voltage of nodes $N_{D1L}$ and $N_{D1R}$ equal to $V_{R1L}$ and $V_{R1R}$, respectively. During a comparison, switches 702 and 704 are opened and nodes $N_{D1L}$ and $N_{D1R}$ are pulled down by discharging currents $I_{1L}$ and $I_{1R}$. When either of nodes $N_{D1L}$ and $N_{D1R}$ becomes low enough to turn on transistor $M_{OR}$ or $M_{OL}$, the comparison result is ready and regeneration starts.

It can be shown that the gain of regenerative latch 700 can be adjusted by varying the difference between the common mode voltage of $V_{R1L}$ and $V_{R1R}$ (i.e., $(V_{R1L}+V_{R1R})/2$) and the common mode voltage of the voltages at nodes $N_{DOL}$ and $N_{DOR}$ (i.e., $V_{DOL}+V_{DOR})/2$). More specifically, the difference between the two common mode voltages can be made more positive to slow down the speed of comparator 604 and reduce noise.

In another embodiment, conversion time margin monitor 614 is configured to use the speed control signal to adjust an operation speed of asynchronous SAR ADC 600 by adjusting an effective size and/or body bias of one or more devices (e.g., transistors) of DAC 610, comparator 604, or asynchronous controller 606. The body bias of transistors in DAC 610, comparator 604, or asynchronous controller 606 can specifically be adjusted to increase the threshold voltages of the transistors and, thereby, reduce switching speed and power consumed. For example, the respective body bias voltages $V_{BOL}$ and $V_{BOR}$ of transistors $M_{OR}$ and $M_{OL}$ can be adjusted to increase the threshold voltages of transistors $M_{OR}$ and $M_{OL}$ and, thereby, reduce switching speed and power consumed by comparator 604.

Figure 8:
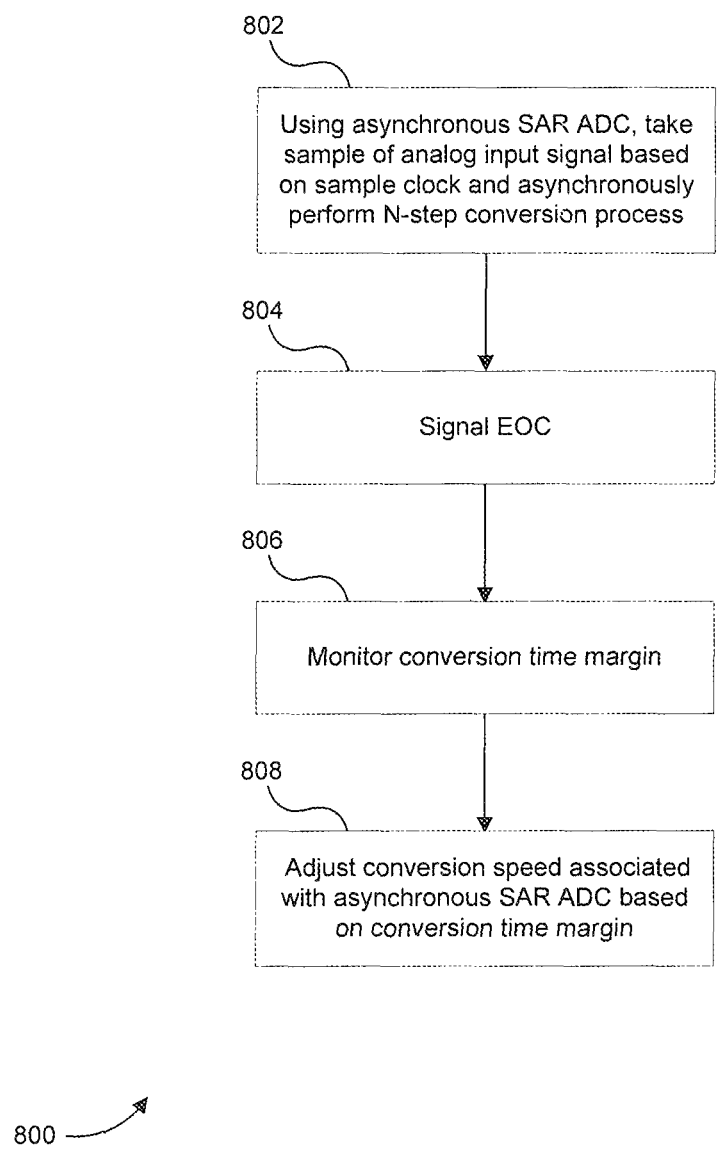
FIG. 8 illustrates a flowchart of a method of operation for an adaptive asynchronous SAR ADC according to embodiments of the present disclosure.

Referring now to FIG. 8, a flowchart 800 of a method of operation for an adaptive asynchronous SAR ADC is illustrated according to embodiments of the present disclosure. The method of flowchart 800 can be implemented by adaptive asynchronous SAR ADC 600 as described above and illustrated in FIG. 6. However, it should be noted that the method of flowchart 800 can be implemented by other asynchronous SAR ADCs.

The method of flowchart 800 begins at step 802. At step 802, an asynchronous SAR ADC takes a sample of an analog input signal (e.g., tracks and holds) based on a sample clock and converts the sample to a digital value using an N-step conversion process as described above in regard to FIG. 6, where N is the resolution of the asynchronous SAR ADC.

At step 804, the asynchronous SAR ADC signals end of conversion to indicate that the final digital value of the sample is available and ready.

At step 806, the conversion time margin is monitored directly and/or indirectly as described above in regard to FIG. 6. The conversion time margin is amount of time between when the final digital value of the sample is available and ready and a subsequent sample of the analog input signal is to be taken by the asynchronous SAR ADC based on the sample clock.

At step 808, the conversion speed associated with the asynchronous SAR ADC is adjusted based on the conversion time margin or an average conversion time margin computed using the conversion time margin measured at step 806. The conversion speed can be adjusted as described above in regard to FIG. 6 to reduce power consumption and/or noise produced by the asynchronous SAR ADC.

3. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. An asynchronous successive approximation register (SAR) analog-to-digital converter (ADC) comprising:
   a sample-and-hold (S/H) circuit configured to take a sample of an analog signal based on a sample clock;
   a digital-to-analog converter (DAC) configured to perform conversions of a digital approximation value into an analog approximation value;
   a comparator configured to perform comparisons based on the analog approximation value and the sample of the analog signal;
   a controller configured to asynchronously determine a final value for each bit of the digital approximation value based on the comparisons to provide a final digital value; and
   a conversion time margin monitor configured to adjust a conversion speed associated with the asynchronous SAR ADC based on an amount of time between when the controller provides the final digital value and the S/H circuit takes a subsequent sample of the analog signal based on the sample clock.

2. The asynchronous SAR ADC of claim 1, wherein the conversion time margin monitor comprises:
   a time to digital converter configured to determine the amount of time between when the controller provides the final digital value and the S/H circuit takes the subsequent sample of the analog signal based on the sample clock.

3. The asynchronous SAR ADC of claim 1, wherein the conversion time margin monitor is configured to adjust the conversion speed by adjusting an operation speed of the DAC, comparator, or controller.

4. The asynchronous SAR ADC of claim 1, wherein the conversion time margin monitor is configured to adjust the conversion speed by adjusting a supply voltage or a supply current used to power the DAC, comparator, or controller.

5. The asynchronous SAR ADC of claim 1, wherein the conversion time margin monitor is configured to adjust the conversion speed associated with the asynchronous SAR ADC by adjusting a size or body bias voltage of a device used to implement the DAC, comparator, or controller.

6. The asynchronous SAR ADC of claim 1, wherein the comparator comprises a regenerative latch.

7. The asynchronous SAR ADC of claim 6, wherein the conversion time margin monitor is configured to adjust the conversion speed associated with the asynchronous SAR ADC by adjusting a common mode voltage or a body bias voltage of the regenerative latch.

8. The asynchronous SAR ADC of claim 1, wherein the S/H circuit and the DAC are implemented by a switched capacitor network.

9. The asynchronous SAR ADC of claim 1, wherein the comparator is configured to perform the comparisons based on a difference between the analog approximation value and the sample of the analog signal.

10. The asynchronous SAR ADC of claim 1, wherein the controller is configured to asynchronously determine the final value for each bit of the digital approximation value, in turn, based on the comparisons to provide the final digital value.

11. A method for reducing a power or noise associated with an asynchronous successive approximation register (SAR) analog-to-digital converter (ADC), the method comprising:
   taking a sample of an analog signal based on a sample clock;
   converting a digital approximation value into an analog approximation value;
   comparing the analog approximation value and the sample of the analog signal;
   asynchronously determining a final value for each bit of the digital approximation value based on the comparing to provide a final digital value; and
   adjusting a conversion speed associated with the asynchronous SAR ADC based on an amount of time between when the final digital value is provided and a subsequent sample of the analog signal is taken based on the sample clock.

12. The method of claim 11, wherein adjusting the conversion speed associated with the asynchronous SAR ADC comprises:
   adjusting a supply voltage or a supply current used to power one or more components of the asynchronous SAR ADC.

13. The method of claim 11, wherein adjusting the conversion speed associated with the asynchronous SAR ADC comprises:
   adjusting an operation speed of one or more components of the asynchronous SAR ADC.

14. The method of claim 11, wherein adjusting the conversion speed associated with the asynchronous SAR ADC comprises:
   adjusting a size or body bias voltage of a device used to implement a component of the asynchronous SAR ADC.

15. An asynchronous successive approximation register (SAR) analog-to-digital converter (ADC) comprising:
   a sample-and-hold (S/H) circuit configured to take a sample of an analog signal based on a sample clock;
   a digital-to-analog converter (DAC) configured to perform conversions of a digital approximation value into an analog approximation value;
   a comparator configured to perform comparisons based on the analog approximation value and the sample of the analog signal;
   a controller configured to asynchronously determine a final value for each bit of the digital approximation value based on the comparisons; and
   a conversion time margin monitor configured to adjust a size or body bias voltage of a device used to implement the DAC, comparator, or controller based on a process variation, temperature variation, or supply voltage variation of the asynchronous SAR ADC.

16. The asynchronous SAR ADC of claim 15, wherein the conversion time margin monitor is further configured to adjust a supply voltage or a supply current used to power the DAC, comparator, or controller based on the process variation, temperature variation, or supply voltage variation of the asynchronous SAR ADC.

17. The asynchronous SAR ADC of claim 15, wherein the conversion time margin monitor is further configured to adjust an operation speed of the DAC, comparator, or controller based on the process variation, temperature variation, or supply voltage variation of the asynchronous SAR ADC.

18. The asynchronous SAR ADC of claim 15, wherein the comparator comprises a regenerative latch.

19. The asynchronous SAR ADC of claim 18, wherein the conversion time margin monitor is further configured to adjust a common mode voltage or a body bias voltage of the regenerative latch based on the process variation, temperature variation, or supply voltage variation of the asynchronous SAR ADC.

20. The asynchronous SAR ADC of claim 15, wherein the device is a regenerative latch in the comparator.

* * * * *